(12) United States Patent
Fishley et al.

(10) Patent No.: US 7,750,460 B2
(45) Date of Patent: Jul. 6, 2010

(54) BALL GRID ARRAY PACKAGE LAYOUT SUPPORTING MANY VOLTAGE SPLITS AND FLEXIBLE SPLIT LOCATIONS

(75) Inventors: Clifford R. Fishley, San Jose, CA (US); Abiola Awujoola, Pleasanton, CA (US); Leonard L. Mora, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 260 days.

(21) Appl. No.: 12/034,745

(22) Filed: Feb. 21, 2008

(65) Prior Publication Data

US 2009/0212413 A1    Aug. 27, 2009

(51) Int. Cl.
*H01L 23/52* (2006.01)
(52) U.S. Cl. .......... 257/691; 257/692; 257/698; 257/700; 257/774; 257/786; 257/E23.079; 257/E23.142
(58) Field of Classification Search ............ 257/691, 257/692, 698, 700, 774, 786, E23.079, E23.142
See application file for complete search history.

(56) References Cited

U.S. PATENT DOCUMENTS

| | | | | |
|---|---|---|---|---|
| 6,064,113 | A | * | 5/2000 | Kirkman ................. 257/691 |
| 6,747,362 | B2 | * | 6/2004 | Barrow ................. 257/786 |
| 6,770,963 | B1 | * | 8/2004 | Wu ................. 257/691 |
| 6,897,555 | B1 | * | 5/2005 | Lim et al. ................. 257/692 |

* cited by examiner

*Primary Examiner*—Andy Huynh
(74) *Attorney, Agent, or Firm*—Christopher P. Maiorana, PC

(57) ABSTRACT

A die package generally including (A) ground paths routing a power ground from a ground power set of contact pads in a first conductive layer to a ground ring in a second conductive layer, (B) core paths routing a core voltage from a core power set of contact pads in the first conductive layer to a core ring in the second conductive layer, and (C) input/output voltage paths routing input/output voltages from an input/output power set of contact pads in the first conductive layer to an input/output ring in the second conductive layer, (i) the input/output ring surrounding the core ring, (ii) the ring being configured to power input and output circuits of the die, (iii) the input/output ring being split into ring segments isolated from each other and (iv) at least one particular ring segment having a length of less than a single connector pitch.

20 Claims, 4 Drawing Sheets

BALL GRID ARRAY PACKAGE LAYOUT SUPPORTING MANY VOLTAGE SPLITS AND FLEXIBLE SPLIT LOCATIONS

FIELD OF THE INVENTION

The present invention relates to chip packaging generally and, more particularly, to a method and/or apparatus for implementing a Ball Grid Array (BGA) package layout supporting many voltage splits and flexible split locations.

BACKGROUND OF THE INVENTION

As integrated circuit package designs have evolved, an increasing interest has been created to supply multiple power voltages to the integrated circuit and have isolation in the power supply nets in the package. Conventional approaches of power distribution in the package support a ground ring and two different power voltage rings to power the integrated circuit. The conventional approaches are not able to support a main power voltage and multiple input/output power voltages or have flexible placement of the input/output power voltages along the die edge.

SUMMARY OF THE INVENTION

The present invention concerns a die package. The package generally comprises (A) a plurality of ground paths routing a power ground from a ground power set of a plurality of contact pads in a first conductive layer of the package to a ground ring in a second conductive layer of the package, wherein the ground ring surrounds a die attach area of the package, (B) a plurality of core paths routing a core voltage from a core power set of the contact pads to a core ring in the second conductive layer, wherein the core ring surrounds the ground ring and (C) a plurality of input/output voltage paths routing a plurality of input/output voltages from an input/output power set of the contact pads to an input/output ring in the second conductive layer, wherein (i) the input/output ring surrounds the core ring, (ii) the input/output ring is configured to power a plurality of input circuits and a plurality of output circuits of a die mounted in the die attach area, (iii) the input/output ring is split into a plurality of ring segments electrically isolated from each other and (iv) at least one particular segment of the ring segments has a length as measured along the input/output ring of less than a single connector pitch to create location flexibility of the input/output voltages.

The objects, features and advantages of the present invention include providing a method and/or apparatus for implementing a ball grid array package layout that may (i) support many input/output (I/O) power voltage splits in an I/O power ring, (ii) support flexible split locations around the I/O power ring, (iii) route I/O power voltages between I/O signal paths, (iv) provide a high level of flexibility in terms of quantity and placement of the voltage splits, (v) reduce editing of the power planes when a split is applied and/or (vi) avoid moving ball contact pads when a split is applied.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Contact pads (e.g., ball pads) that may bring power into a package are generally located directly below or nearby multiple voltage supply rings that may be located near a die (or chip) mounted on a substrate of the package. Solder balls (or pins) at each of the contact pads may be arranged in (i) a continuous array or (ii) a depopulated array. Vias generally interconnect the contact pads in a bottom conductive (e.g., metal) layer of the package up to the voltage supply rings in a top conductive (e.g., metal) layer of the package to form signal paths and power paths. For a package with a defined contact pitch, balls pitch or pin pitch (e.g., 1 millimeter), the present invention may support ring splits down to the contact pitch. Finer pitches may be achieved by using additional staggered rows of the contact pads. Other contact pitches, both coarser and finer, and/or arrangements may be implemented to meet the criteria of a particular application. Split power planes may be employed to support one or more splits of the voltage supply ring. The power planes may be located in any layer within the package including but not limited to the bottom conductive layer.

Figure 1:
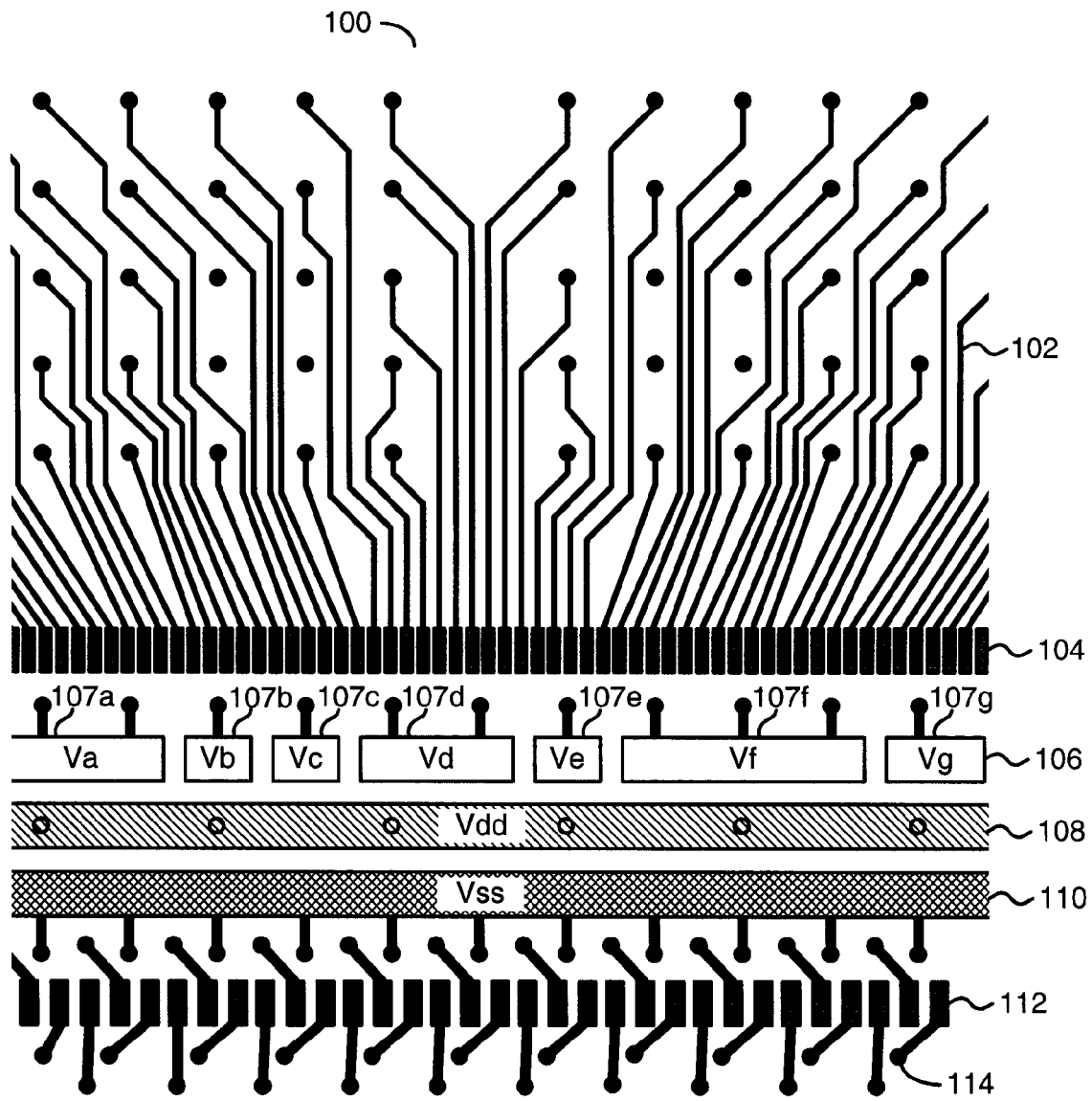
FIG. 1 is a top-view diagram of a portion of a package in accordance with a preferred embodiment of the present invention.

Referring to FIG. 1, a top-view diagram of a portion of a package 100 is shown in accordance with a preferred embodiment of the present invention. The top view generally shows a top metal (or conductive) layer patterned into a plurality of elements. The elements generally comprise multiple top traces (or wires) 102, multiple outer bonding fingers (or wire bond pads) 104, a split input/output (I/O) power ring 106, a core power ring 108, a ground ring 110, multiple inner bonding fingers (or wire bonding pads) 112, multiple top via connections 114 and a die attachment paddle area 116. Several top via contact areas 118 may be defined on an underside of at least the core power ring 108 and the die attachment paddle area 116. Other metal areas may be used to define the top via contact areas 118 to meet the criteria of a particular application. The top via contact areas 118 may be represented by small unfilled circles. Individual top via connections 114 may be represented by small filled circles.

The I/O power ring 106, the core power ring 108 and the ground ring 110 may provide all of the power consumed by the die. The ground ring 110 is generally in electrical communication (e.g., connected through the top conductive layer, the vias and a bottom conductive layer) with a ground set of the balls or pins mounted on a bottom side of the package 100. The ground ring 110 may connect to a ground power (e.g., Vss or GND) of an external power source. The core power ring 108 may be in electrical communication with a core set of the balls or pins to receive a core voltage (e.g., Vdd) from the external power source. The core voltage is generally used by internal circuitry in a core area of the die.

The I/O power ring 106 may be split into multiple ring segments 107a-107g. Each of the ring segments 107a-107g may be in electrical communication with an I/O power set of the balls or pins to receive various I/O voltages (e.g., Va to Vg) from the external power source. The I/O voltages are usually different from the core voltage. Signal receivers and signal drivers (both unidirectional and bidirectional) in the die may be powered by the I/O voltages as designed. For example, drivers and receivers in communication with external transistor-transistor-logic circuitry may receive 5 volt power through one or more ring segments 107a-107g. In another example, a low noise differential receiver may receive clean ±3 volt power through two or more ring segments 107a-107g.

A length of the ring segments 107a-107g may vary depending on the amount of current flowing through the respective segments. For example, the ring segment 107d may have a length, as measured along the I/O power ring 106, of slightly less than twice the contact pitch. Gaps between the ring segment 107d and the neighboring ring segments 107c and 107e prevent the ring segment 107d from having a length equal to or greater than twice the contact pitch. Larger ring segments 107a-107g may be created to meet the criteria of a particular application. A smallest ring segment may have a length of less than the contact pitch due to the inter-segment gaps. The smallest ring segment (e.g., the ring segment 107c) is generally associated with a single ball or pin.

Figure 2:
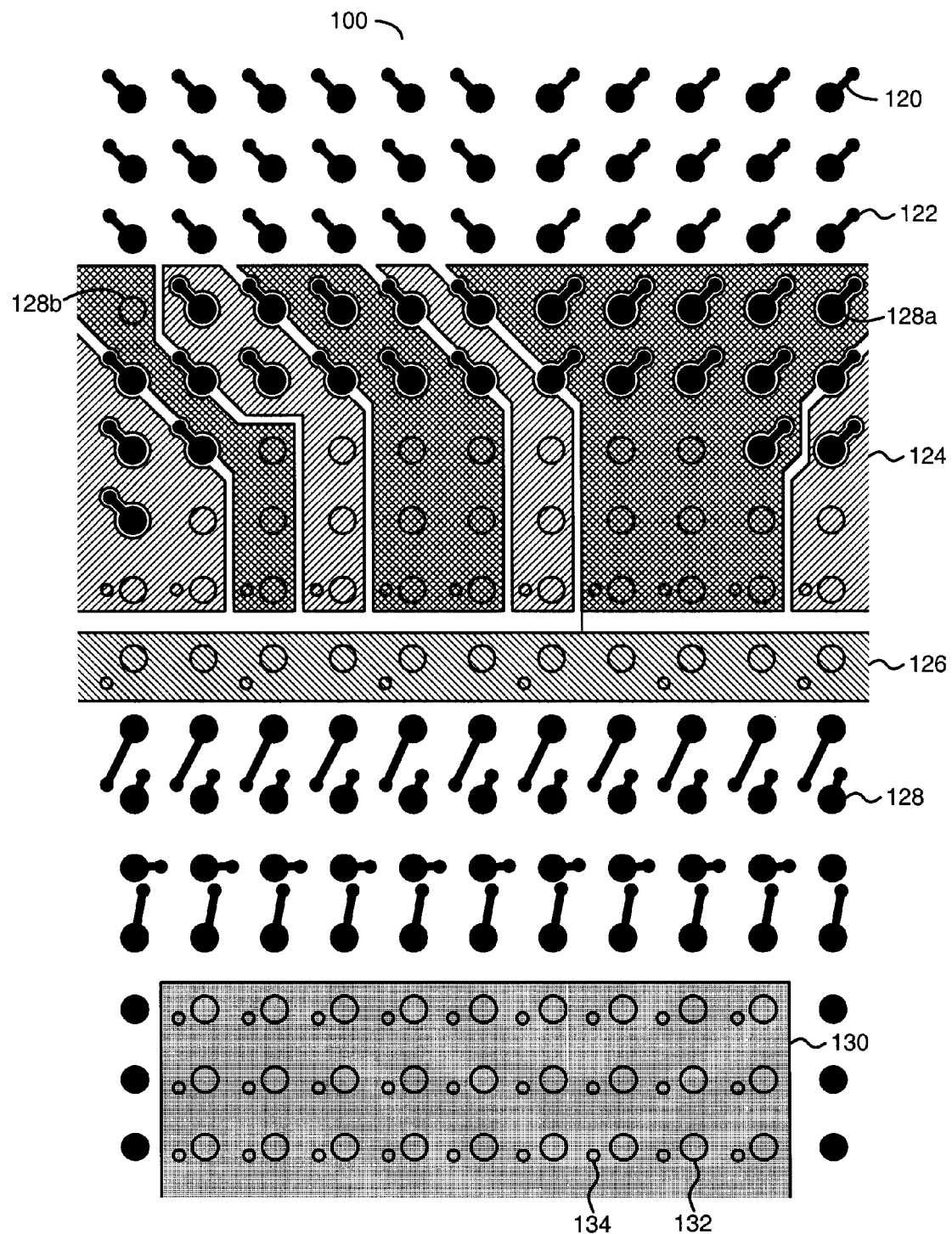
FIG. 2 is a bottom-view diagram of the portion of the package illustrated in FIG. 1.

Referring to FIG. 2, a bottom-view diagram of the portion of the package 100 illustrated in FIG. 1 is shown. The bottom view generally shows the bottom metal (or conductive) layer patterned into a plurality of elements. The elements generally comprise multiple bottom traces (or wires) 120, several the bottom via connections 122, multiple I/O power planes 124, a core power plane 126, several instances of individual contact pads 128 and a ground plane 130. Several ball contact areas 132 for attaching the balls may be defined on at least the I/O power planes 124, the core power plane 126 and the ground plane 130. Other metal areas may be used to define the ball contact areas 132 to meet the criteria of a particular application. The ball contact areas 132 are generally represented by large unfilled circles. The individual contact pads 128 may be represented by the large filled circles. Several bottom via contact areas 134 may be defined on a top side of at least the I/O power planes 124, the core power plane 126 and the ground plane 130. Other metal areas may be used to define the bottom via contact areas 134 to meet the criteria of a particular application. The bottom via connections 122 may be represented by the small filled circles. The bottom via contact areas 134 may be represented by the small unfilled circles.

The I/O power planes 124 may extend around several contact pads 128 (e.g., a contact pad 128a) used to carry input signals, output signals, bidirectional signals, reference signals, clock signals and other signals received at and/or transmitted from the die. Furthermore, one or more of the I/O power planes 124 may extend toward an outer edge of the package 100 to permit I/O voltages to be received on one or more balls (e.g., through a contact pad 128b) located among the I/O signal balls. Such a capability generally allows a design engineer flexibility in assigning the I/O power voltages to the balls.

Figure 3:
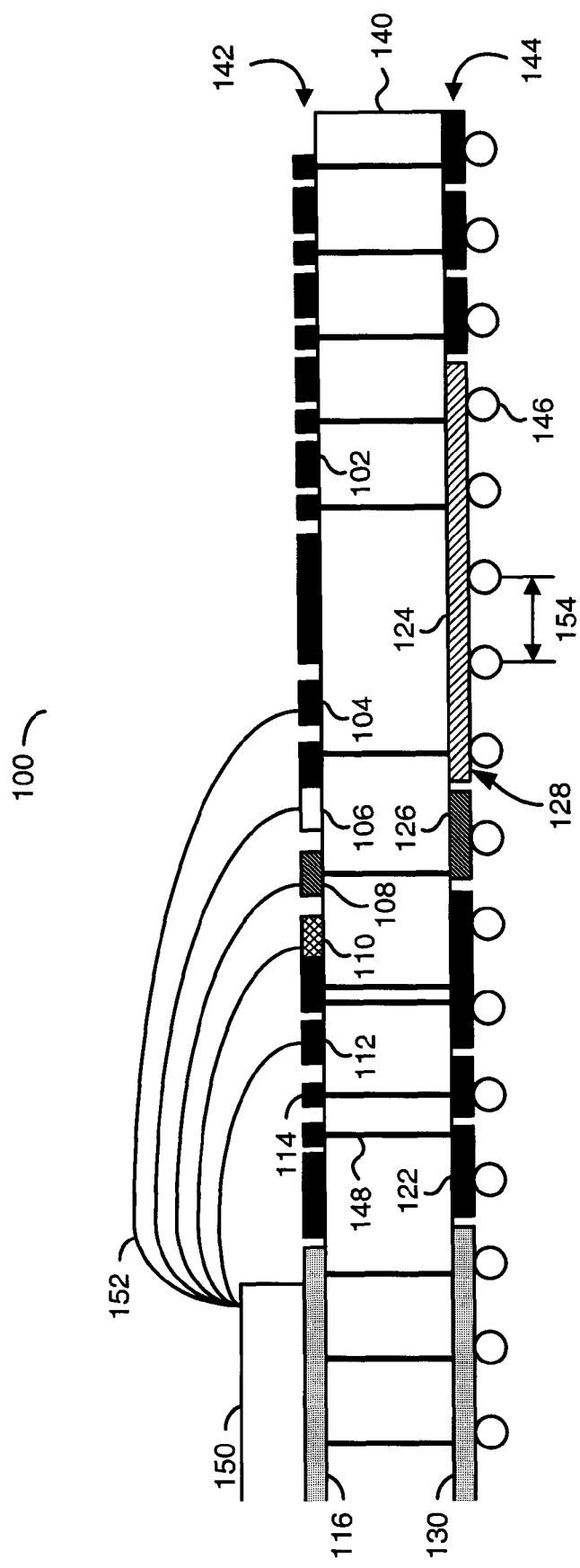
FIG. 3 is a cross-sectional diagram of a die and the portion of the package illustrated in FIGS. 1 and 2.

Referring to FIG. 3, a cross-sectional diagram of the die and the portion of the package 100 illustrated in FIGS. 1 and 2 is shown. The diagram generally shows vertical structural elements of the package 100. The elements generally comprise a substrate (or chip carrier) 140, the top conductive layer 142, the bottom conductive layer 144, multiple solder balls 146 and multiple via conductors 148. The top conductive layer 142 may include the top traces 102, the outer bonding fingers 104, the I/O power ring 106, the core power ring 108, the ground ring 110, the inner bonding fingers 112, the top via connections 114 and the die attachment paddle area 116. The bottom conductive layer 144 generally includes the bottom traces 120, the bottom via connections 122, the I/O power planes 124, the core power plane 126, the contact pads 128 and the ground plane 130. In some embodiments, one or more additional conductive layers may be created between the top conductive layer 142 and the bottom conductive layer 144 to aid in routing and shielding.

The die 150 may be mounted to the package 100 in the die attachment paddle area 116. Multiple wire bonds 152 generally connect the die 150 to the outer bonding fingers 104, the I/O power ring 106, the core power ring 108, the ground ring 110 and the inner bonding fingers 112. The wire bonds 152 may be tiered (as shown) to accommodate the different distances from an outer edge of the die 150 to each of the inner bonding fingers 112, the ground ring 110, the core power ring 108, the I/O power ring 106 and the outer bonding fingers 104. Other die to package connection technologies may be implemented to meet the criteria of a particular application. A contact pitch is generally illustrated by the reference number 154 and the associated lines and arrows. The contact pitch may be a center-to-center space between immediately adjacent balls 146.

Electrical power and ground may be received by the die 150 across many different paths between the solder balls 146 and the wire bonds 152. For example, an I/O power voltage applied to the balls 146 may traverse the ball contact areas 132, the bottom traces 120 and the ball contact pads 128 in the bottom conductive layer 144. The via conductors 148 may communicate the I/O power voltage from the bottom conductive layer 144 to the top conductive layer 142 via connections 114. Once in the top conductive layer 142, the I/O power voltage may be routed along the top traces 102 to the I/O power ring 106, onto the wire bonds 152 and finally to the die 150. Ground power and core power voltages applied to the solder balls 146 may follow similar paths from the bottom conductive layer 144, to the top conductive layer 142, to the appropriate ring and then across the wire bonds 152 to the die 150.

Figure 4:
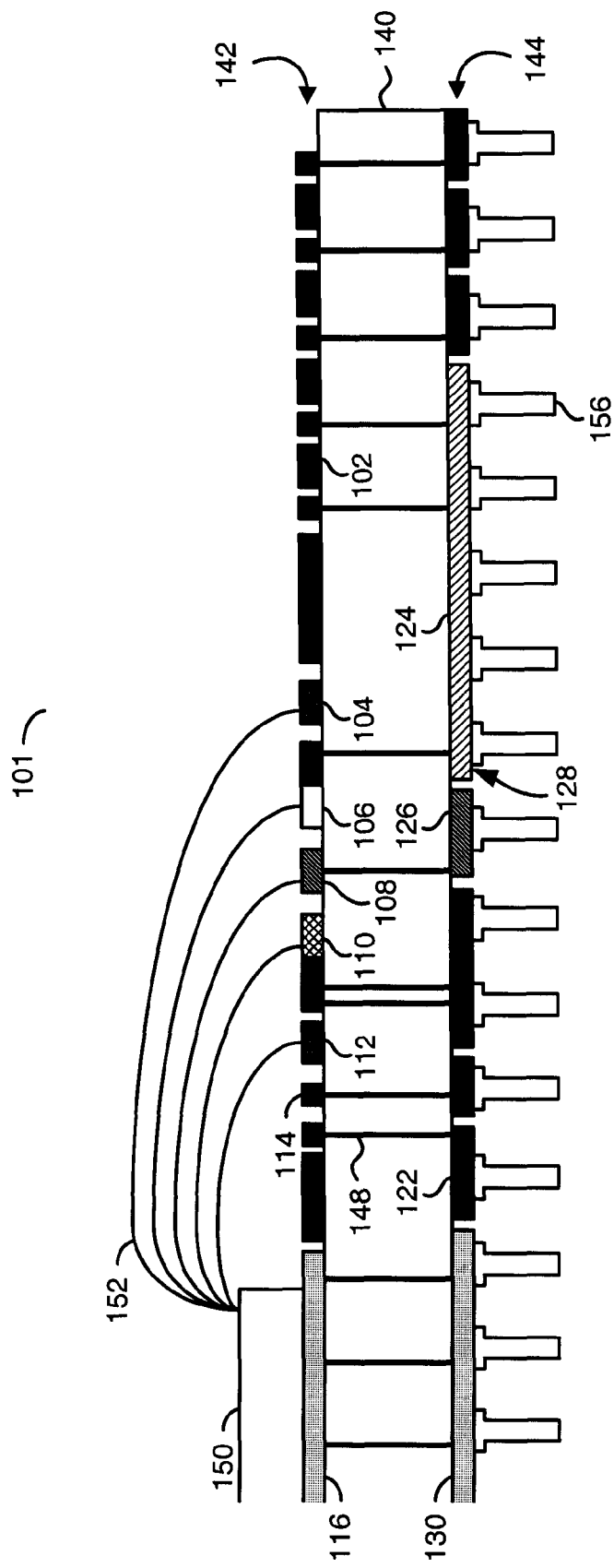
FIG. 4 is a cross-sectional diagram of the die and a portion of another package.

Referring to FIG. 4, a cross-sectional diagram of the die 150 and a portion of another package 101 is shown. The package 101 may have a similar structure to the package 100. At least one difference between the packages is that the package 101 may have an array of pins 156 in place of the solder balls 146.

Splitting of the one or more voltage supply rings at various locations may create a flexible technique to meet power specifications of the die. The present invention generally supports many ring splits without wasting valuable space in the package. Splitting the voltage supply rings into multiple ring segments may be applied to one or more of the rings in the package. Where the package is a multi-chip module, a dedicated group of voltage supply rings may be formed around each of the chips. Splitting of the various voltage supply rings into segments may be defined individually for each ring within each of the groups.

A basic layout of the package may remain unchanged to support movement of the splits during development. For example, if a split is moved, the ball pads may be reassigned appropriately. The reassignment generally enables easy design editing. The present invention may provide a high level of flexibility of quantity and placement of the voltage splits. The splits may be applied without moving ball/pin contact pads or major editing of the power planes.

The functions performed by the diagrams of FIGS. 1-4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A package comprising:
a plurality of ground paths routing a power ground from a ground power set of a plurality of contact pads in a first conductive layer of said package to a ground ring in a second conductive layer of said package, wherein said ground ring surrounds a die attach area of said package;
a plurality of core paths routing a core voltage from a core power set of said contact pads to a core ring in said second conductive layer, wherein said core ring surrounds said ground ring; and
a plurality of input/output voltage paths routing a plurality of input/output voltages from an input/output power set of said contact pads to an input/output ring in said second conductive layer, wherein (i) said input/output ring surrounds said core ring, (ii) said input/output ring is configured to power a plurality of input circuits and a plurality of output circuits of a die mounted in said die attach area, (iii) said input/output ring is split into a plurality of ring segments electrically isolated from each other and (iv) at least one particular segment of said ring segments has a length as measured along said input/output ring of less than a single connector pitch to create location flexibility of said input/output voltages.

2. The package according to claim 1, wherein said particular segment communicates with a single particular connector of said input/output power set.

3. The package according to claim 1, wherein said particular segment communicates with a plurality of particular contact pads of said input/output power set.

4. The package according to claim 1, wherein said particular segment comprises a plurality of said particular segments.

5. The package according to claim 1, further comprising a plurality of first signal paths routing a plurality of first signals from a first signal set of said contact pads to a plurality of first bonding pads in said second conductive layer, wherein said first bonding pads surround said input/output ring.

6. The package according to claim 5, further comprising a plurality of voltage paths routing said input/output voltages along a plurality of input/output power planes in said first conductive layer, wherein each respective one of said input/output power planes corresponds to a respective one of said ring segments.

7. The package according to claim 6, wherein at least one of said input/output voltages routes between at least two of said contact pads of said first signal set.

8. The package according to claim 6, wherein at least one of said input/output power planes surrounds at least one of said contact pads of said first signal set.

9. The package according to claim 1, further comprising a plurality of second signal paths routing a plurality of second signals from a second signal set of said contact pads to a plurality of second bonding pads in said second conductive layer, wherein said second bonding pads are disposed between said die attachment area and said ground ring.

10. The package according to claim 1, further comprising a plurality of solder balls connected to said contact pads to form a ball gird array package.

11. A method of routing a plurality of input/output voltages in a package, comprising the steps of:
(A) routing a power ground from a ground power set of a plurality of contact pads in a first conductive layer of said package to a ground ring in a second conductive layer of said package, wherein said ground ring surrounds a die attach area of said package;
(B) routing a core voltage from a core power set of said contact pads to a core ring in said second conductive layer, wherein said core ring surrounds said ground ring; and
(C) routing said input/output voltages from an input/output power set of said contact pads to an input/output ring in said second conductive layer, wherein (i) said input/output ring surrounds said core ring, (ii) said input/output ring is configured to power a plurality of input circuits and a plurality of output circuits of a die mounted in said die attach area, (iii) said input/output ring is split into a plurality of ring segments electrically isolated from each other and (iv) at least one particular segment of said ring segments has a length as measured along said input/output ring of less than a single connector pitch to create location flexibility of said input/output voltages.

12. The method according to claim 11, wherein said particular segment communicates with a single particular connector of said input/output power set.

13. The method according to claim 11, wherein said particular segment communicates with a plurality of particular contact pads of said input/output power set.

14. The method according to claim 11, wherein said particular segment comprises a plurality of said particular segments.

15. The method according to claim 11, further comprising the step of:
routing a plurality of first signals from a first signal set of said contact pads to a plurality of first bonding pads in said second conductive layer, wherein said first bonding pads surround said input/output ring.

16. The method according to claim 15, further comprising the step of:
routing said input/output voltages along a plurality of input/output power planes in said first conductive layer, wherein each respective one of said input/output power planes corresponds to a respective one of said ring segments.

17. The method according to claim 16, further comprising the step of:
routing at least one of said input/output voltages between at least two of said contact pads of said first signal set.

18. The method according to claim 16, wherein at least one of said input/output power planes surrounds at least one of said contact pads of said first signal set.

19. The method according to claim 11, further comprising the step of:

routing a plurality of second signals from a second signal set of said contact pads to a plurality of second bonding pads in said second conductive layer, wherein said second bonding pads are disposed between said die attachment area and said ground ring.

20. A package comprising:

means for routing a power ground from a ground power set of a plurality of contact pads in a first conductive layer of a package to a ground ring in a second conductive layer of said package, wherein said ground ring surrounds a die attach area of said package;

means for routing a core voltage from a core power set of said contact pads to a core ring in said second conductive layer, wherein said core ring surrounds said ground ring; and means for routing a plurality of input/output voltages from an input/output power set of said contact pads to an input/output ring in said second conductive layer, wherein (i) said input/output ring surrounds said core ring, (ii) said input/output ring is configured to power a plurality of input circuits and a plurality of output circuits of a die mounted in said die attach area, (iii) said input/output ring is split into a plurality of ring segments electrically isolated from each other and (iv) at least one particular segment of said ring segments has a length as measured along said input/output ring of less than a single connector pitch to create location flexibility of said input/output voltages.

* * * * *